United States Patent [19]

Shinozaki et al.

[11] Patent Number: 5,200,292
[45] Date of Patent: Apr. 6, 1993

[54] LIGHT-SENSITIVE COMPOSITION CONSISTING ESSENTIALLY OF, IN ADMIXTURE A NONIONIC AROMATIC DIAZO COMPOUND AND A CATIONIC DYE/BORATE ANION COMPLEX

[75] Inventors: Fumiaki Shinozaki; Junichi Fujimori, both of Shizuoka, Japan

[73] Assignee: Fuji Photo Film Co., Ltd., Kanagawa, Japan

[21] Appl. No.: 466,548

[22] Filed: Jan. 17, 1990

[30] Foreign Application Priority Data

Jan. 17, 1989 [JP] Japan .................................. 1-8156

[51] Int. Cl.$^5$ .................. G03C 1/54; G03F 7/023; G03F 7/031
[52] U.S. Cl. .................. 430/178; 430/65; 430/191; 430/192; 430/193; 430/281; 430/283; 430/285; 430/341; 430/926
[58] Field of Search ............... 430/339, 341, 340, 337, 430/178, 926, 191, 288, 281, 192, 193

[56] References Cited

U.S. PATENT DOCUMENTS

| | | | |
|---|---|---|---|
| 3,567,453 | 3/1971 | Borden | 430/926 |
| 4,252,884 | 2/1981 | Bennett et al. | 430/341 |
| 4,343,891 | 8/1982 | Aasen et al. | 430/337 |
| 4,370,401 | 1/1983 | Winslow et al. | 430/178 |
| 4,450,227 | 5/1984 | Holmes et al. | 430/340 |
| 4,511,642 | 4/1985 | Higashi et al. | 430/178 |
| 4,772,530 | 9/1988 | Gottschalk et al. | 430/914 |
| 4,772,541 | 9/1988 | Gottschalk et al. | 430/914 |
| 4,788,124 | 11/1988 | Wright | 430/340 |
| 4,800,149 | 1/1989 | Gottschalk et al. | 430/339 |
| 4,842,980 | 6/1989 | Gottschalk et al. | 430/914 |
| 5,015,549 | 5/1991 | Grosso et al. | 430/45 |

FOREIGN PATENT DOCUMENTS

0040977 12/1981 European Pat. Off. .
0223587 5/1987 European Pat. Off. .
893063 6/1959 United Kingdom .

OTHER PUBLICATIONS

Journal of Printing, vol. 74, 9 pp. 12 and 17 (1991) w/ translation of certain parts in Declaration under 37C.F.R.1.68.

D. G. Borden: "Review of Light-Sensitive Tetraarylborates" Photographic Science and Engineering vol. 16, No. 4, Jul. 1972, Washington pp. 300-312.

Primary Examiner—Charles L. Bowers, Jr.
Assistant Examiner—John S. Chu
Attorney, Agent, or Firm—Sughrue, Mion, Zinn, Macpeak & Seas

[57] ABSTRACT

A light-sensitive composition is provided comprising (a) an aromatic diazo compound and (b) a cationic dye/borate anion complex.

In a preferred embodiment, the cationic dye/anionic borate dye complex is represented by the general formula (I):

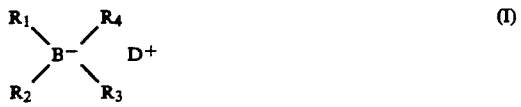

wherein $D^+$ represents a cationic dye; and $R_1$, $R_2$, $R_3$ and $R_4$, which may be the same or different, each represents an unsubstituted or substituted alkyl group, an unsubstituted or substituted aryl group, an unsubstituted or substituted aralkyl group, an unsubstituted or substituted alkenyl group, an unsubstituted or substituted alkynyl group, an unsubstituted or substituted alicyclic group, or an unsubstituted or substituted heterocyclic group.

The aromatic diazo compound can be a nonionic diazo compound.

The light-sensitive compound can further comprise a radical-polymerizable unsaturated compound.

4 Claims, 1 Drawing Sheet

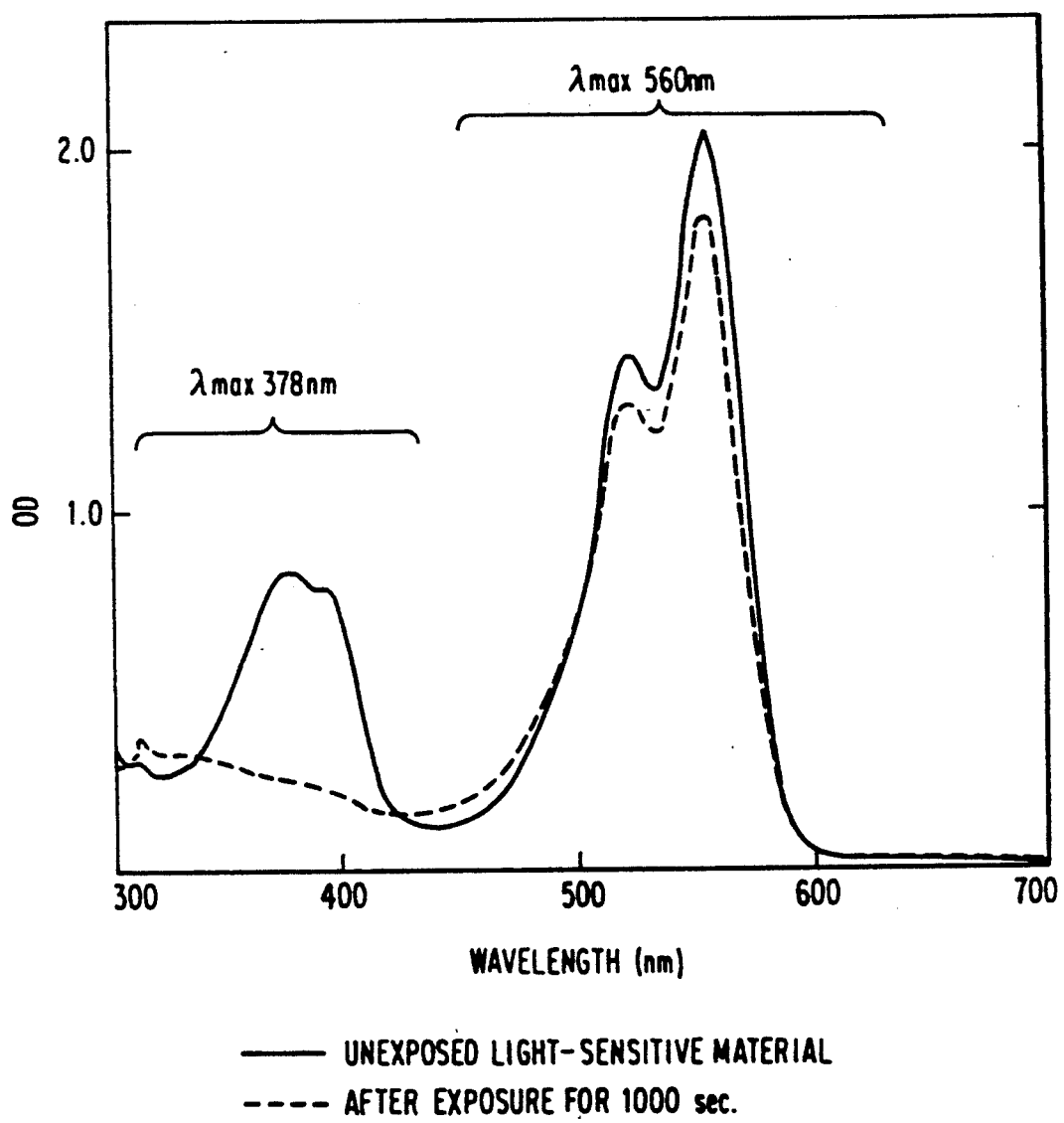

LIGHT-SENSITIVE COMPOSITION CONSISTING ESSENTIALLY OF, IN ADMIXTURE A NON-IONIC AROMATIC DIAZO COMPOUND AND A CATIONIC DYE/BORATE ANION COMPLEX

FIELD OF THE INVENTION

The present invention relates to a high sensitivity diazo process light-sensitive composition and a photopolymerizable composition capable of being spectrally sensitized in the visible light range.

BACKGROUND OF THE INVENTION

As diazo processes are concerned, there are various known image formation processes such as dye image formation processes which utilize the photodecomposition of an aromatic diazo compound such as a diazonium salt, a diazosulfonate, an iminoquinone diazide or an iminoquinone diazide, a optionally utilizing a coupling agent. The process comprises preparation of a printing plate, a proof or a masking film utilizing a curing reaction or a solubitization phenomenon, or preparation of vesicular image formation.

As photopolymerization processes are concerned, in the field of printing plates, proofing materials, masking films, and resist materials, various known image formation processes utilizing changes insolubility, viscosity, adhesion or the like due to photo-setting exist.

However, in both diazo processes and photopolymerization processes, no decisive high sensitivity systems sensitive in the visible wavelength range are known.

In diazo processes, the energy required for photodecomposition of a photodecomposable aromatic diazo compound is generally extremely high. Furthermore, the wavelength in which the photodecomposable aromatic diazo compound is sensitive is limited to the blue region in the visible light range. Therefore, the image forming material which can be obtained by using a diazo process is limited to low and ultraviolet sensitive materials.

Thus, intensive studies have been made concerning the spectral sensitization of photodecomposable aromatic diazo compounds in the visible light range. For example, it has been known that certain dyes such as riboflavin (M. M. Oreshin, et al., Zh Nauchi Prikl Fotgr Kinematogr 26, 323 (1981)), porphyrin (Ando, et al., J. Org. Chem., Vol. 37, 2900 (1982)) and chlorophyl can serve as spectral sensitizers for diazonium salts or diazosulfonate. In other sensitization processes, a diazo process light-sensitive material comprising at least one compound selected from the group consisting of sulfinic acid and sulfinates and a sensitizing dye in an aromatic diazo compound has been known as disclosed in JP-B-50-21247. (The term "JP-B" as used herein means an "examined Japanese patent publication".)

However, these processes are disadvantageous in that they are poor in stability and they cannot freely select a spectral wavelength range. Thus, these processes have not yet been put into practical use. Furthermore, these systems have little or no effects on the spectral sensitization for photodecomposition of a diazo compound such as naphthoquinonediazide.

For photopolymerization processes, various spectral sensitization methods have been intensively developed. However, these spectral sensitization methods are limited to 500 nm. Thus, no high sensitivity stable systems capable of being spectrally sensitized in a region between 500 nm and the infrared range have been put into practical use.

One of the approaches taken to overcome these defects is to use a photopolymerization initiator made of a cationic dye/borate anion complex as described in U.S. Pat. Nos. 4,772,541 and 4,800,149, JP-A-62-143044, JP-A-64-13139, JP-A-64-13140, JP-A-64-13141, JP-A-64-13142, JP-A-64-13143, JP-A-64-13144, JP-A-64-17048, JP-A-64-35548, JP-A-64-40943, JP-A-64-72150, JP-A-64-84245, JP-A-64-88444, JP-A-64-90202, JP-A-1-100536, JP-A-1-138204, JP-A-1-152108 and JP-A-1-152450. (The term "JP-A" as used herein means an "unexamined published Japanese patent application".) This system can freely be spectrally sensitized in a region between the blue light range and the infrared range, and exhibits an excellent stability and a high sensitivity, but its sensitivity is still in the order of a few mJ/cm$^2$. Thus, it has been desired to further increase the sensitivity of such a system to provide a practical system.

Further, the use of a photodecoloring compound made of a cationic dye/borate anion complex as described in U.S. Pat. No. 4,307,182 and JP-A-59-107350, the spectral sensitization of a diazo compound as described in Yamase, Inoue, et al., Photo. Sci. Eng., vol. 19(1), 57(1975), Yamase, et al., Bull. Chem. Soc. Japan, vol. 49(1), 351(1976) and Enmanji, J. Inag. Sci., vol. 31(4), 169(1987), and the use of a photopolymerization initiator made of a diazonium salt as described in U.S. Pat. Nos. 2,976,145 and 1,204,069, EP-0161660, DE 1,269,480B, and JP-A-63-37344 have been reported, but the methods as described in these references have not been satisfactory for the objects of the present invention.

SUMMARY OF THE INVENTION

It is therefore an object of the present invention to provide a light-sensitive composition which exhibits a high sensitivity, a wide spectral sensitivity range and an excellent preservability in both diazo processes and photopolymerization photographic processes.

It is another object of the present invention to provide a novel light-sensitive composition which enables an efficient spectral sensitization of an aromatic diazo compound such as photodecomposable naphthoquinonediazide whose spectral sensitization for photodecomposition has long been considered to be impossible in diazo processes.

These and other objects of the present invention will become more apparent from the following detailed description and examples.

These objects of the present invention are accomplished with a light-sensitive composition comprising (a) an aromatic diazo compound and (b) a cationic dye/borate anion complex.

The cationic dye/anionic borate complex can be represented by the general formula (I):

wherein D$^+$ represents a cationic dye; and R$_1$, R$_2$, R$_3$ and R$_4$, which may be the same or different, each represents an unsubstituted or substituted alkyl group, an unsubstituted or substituted aryl group, an unsubstituted or substituted aralkyl group, an unsubstituted or substituted alkenyl group, an unsubstituted or substituted alkynyl group, an unsubstituted or substituted alicyclic group, or an unsubstituted or substituted heterocyclic group. These complexes include those obtained by complexing two or more dye cation clusters with two or more borate anions.

BRIEF DESCRIPTION OF THE DRAWINGS

The FIGURE illustrates the absorption spectrum of the light-sensitive material of Example 1 before and after exposure, showing that the absorption at 378 nm disappears after exposure and an aromatic diazo compound incorporated therein is decomposed.

DETAILED DESCRIPTION OF THE INVENTION

Examples of the cationic dyes to be used in the present invention include cyanine dyes and dyes comprising a cation portion such as a quaternary ammonium ion covalently bonded to other neutral dye structures via a bonding group.

Cationic dye/borate anion complexes are known in the art. Examples of methods for the preparation of these complexes and the use of these complexes in an image formation system are described in U.S. Pat. Nos. 3,567,453, 4,307,182, 4,343,891, 4,447,521, and 4,450,227.

For example the cationic dye/borate anion complex to be used in the present invention can be prepared by allowing a borate salt and a dye to react in a known counter ion exchange process. This process is further disclosed in Hishiki, Y., Repts. Sci-Research Inst. (1953), 29, pp 72 to 79. Examples or useful borate salts include sodium salts such as sodium tetraphenyl borate, sodium triphenyl butyl borate and sodium trianisyl butyl borate, and ammonium salts such as tetraethyl ammonium tetraphenyl borate.

Examples of useful cationic dyes to be used in the present invention include photo-reducible cationic dyes capable of forming a complex which is stable in a dark place with a borate anion, such as cationic methine, polymethine, triarylmethane, indoline, thiazine, xanthene, oxazine and acridine dyes. More particularly, these dyes are cationic cyanine, carbocyanine, hemicyanine, rhodamine and azomethine dyes.

Specific examples of such dyes include methylene blue, safranine O, malachite green, cyanine dyes of the general formula (II) and rhodamine dyes of the general formula (III) (e.g., Rhodamine B or Rhodamine 6G).

Cationic cyanine dyes disclosed in U.S. Pat. No. 3,495,987 are believed to be useful in the present invention.

(II)

wherein n represents 0 or an integer of 1 to 3; R represents an alkyl group; and Y represents CH—CH, N—CH$_3$, C(CH$_3$)$_2$, O, S or Se.

In the general formula (II), R is preferably a lower alkyl group (preferably having 1 to 8 carbon atoms) or an alkyl group (preferably having 1 to 5 carbon atoms) substituted by a carboxyl group, a sulfo group, a hydroxyl group, a halogen atom, an alkoxy group having 1 to 4 carbon atoms, a phenyl group or a substituted phenyl, for example, β-sulfoethyl, γ-sulfopropyl, γ-sulfobutyl, δ-sulfobutyl, 2-[2-(3-sulfopropoxy)ethoxy]ethyl, 2-hydroxysulfopropyl, 2-chlorosulfopropyl, 2-methoxyethyl, 2-hydroxyethyl, carboxymethyl, 2-carboxyethyl, 2,2,3,3'-tetrafluoropropyl, 3,3,3-trifluoroethyl, an alkyl group, etc.

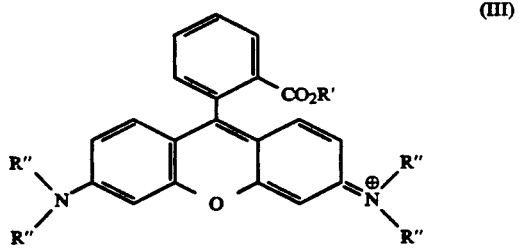
(III)

wherein R' and R" each represents a hydrogen atom, an alkyl group (preferably 1 to 6 carbon atoms), an aryl group or combination thereof, for example, methyl, ethyl, propyl, butyl, pentyl, hexyl, phenyl, benzyl, etc.

The borate anion of the present invention is so designed that a borate radical produced by the transfer of an electron to a dye upon exposure to light easily dissociates into a radical as follows:

For example, triphenylbutyl borate anion and trianisylbutyl borate anion easily dissociate into triphenyl boran or trianisyl boran and a butyl radical. Thus, these anions are particularly preferred anions. On the other hand, tetrabutyl borate anion does not easily dissociate probably because a tetrabutyl borate radical produced therefrom is so unstable that it accepts an electron from a dye. Similarly, tetraphenyl borate anion functions poorly because it cannot easily produce a phenyl radical.

In the borate anion represented by the general formula (I), one or two of R$_1$, R$_2$, R$_3$ and R$_4$ are preferably alkyl groups. R$_1$, R$_2$, R$_3$ and R$_4$ each may contain 20 or less carbon atoms, preferably 1 to 7 carbon atoms. A preferable combination of R$_1$, R$_2$, R$_3$ and R$_4$ is one or more alkyl groups and one or more aryl groups, or one or more alkyl groups and one or more aralkyl groups. Particularly, a combination of three aryl groups and one alkyl group is most preferred.

Typical examples of alkyl groups represented by R$_1$, R$_2$, R$_3$ and R$_4$ include methyl, ethyl, propyl, butyl, pentyl, hexyl, octyl and stearyl groups. Such an alkyl group may be substituted by one or more halogen atoms, one or more cyano, acyloxy, acyl, alkoxy or hydroxy groups.

Typical examples of aryl groups represented by R$_1$, R$_2$, R$_3$ and R$_4$ include phenyl, naphthyl, and substituted aryl groups such as anisyl, and alkaryl such as methyl phenyl and dimethyl phenyl.

Typical examples of aralkyl groups represented by R$_1$, R$_2$, R$_3$ and R$_4$ include benzyl and phenethyl groups. Typical examples of alicyclic groups represented by R$_1$, R$_2$, R$_3$ and R$_4$ include cyclobutyl, cyclopentyl and cyclohexyl groups. Examples of an unsubstituted alkynyl groups represented by R$_1$, R$_2$, R$_3$ and R$_4$ include propynyl and ethynyl groups. Examples of substituted alkynyl groups represented by R$_1$, R$_2$, R$_3$ and R$_4$ include 3-chloropropynyl group. Examples of unsubstituted alkenyl groups represented by $R_1$, $R_2$, $R_3$ and $R_4$ include propenyl and vinyl groups. Examples of substituted alkenyl groups represented by $R_1$, $R_2$, $R_3$ and $R_4$ include 3-chloropropenyl and 2-chloroethenyl groups. Examples of unsubstituted heterocyclic groups represented by $R_1$, $R_2$, $R_3$ and $R_4$ include 3-thiophenyl and 4-pyridinyl groups. Examples of substituted heterocyclic groups represented by $R_1$, $R_2$, $R_3$ and $R_4$ include 4-methyl-3-thiophenyl group.

In general, useful cationic dye/borate anion complexes must be empirically confirmed. A combination of a cationic dye and a borate anion having a useful possibility can be fixed by Weller's equation (Rehm, D. and Weller, A., Isr. J. Chem., (1970), 8, 259 to 271). The equation can be simplified as follows:

$$\Delta G = E_{ox} - E_{red} - E_{h\nu}$$

wherein $\Delta G$ represents the change in Gibbs' free energy; $E_{ox}$ represents the oxidation potential of borate anion $BR_4'''-$; $E_{red}$ represents the reduction potential of an anionic dye; and $E_{h\nu}$ represents the energy of light used for the excitation of the dye.

It is believed that a useful complex has a negative free energy change. Similarly, the difference in the reduction potential of the dye and the oxidation potential of borate must be negative with respect to a complex which is stable in a dark place.

Namely, $$E_{ox} - E_{red} > 0$$

As previously mentioned, this is a simplified equation and thus does not absolutely predict if a complex is useful in the present invention. There are many other factors which affect such a decision. One of these factors is the effect of the use of a monomer on a complex. It is known that if Weller's equation gives an excessive negative value, there can be some deviation from the equation. Moreover, Weller's equation only predicts the transfer of electrons but it does not predict if a particular dye complex is an efficient polymerization initiator or not. Thus, this equation is only a first approximation.

Particular examples of cationic dye/borate anion complexes useful in the present invention will be shown hereafter together with their $\lambda_{max}$.

| Complex No. | Structure | $\lambda_{max}$ |
|---|---|---|
| 1 | [bis-benzothiazole with CH$_3$ bridge, N-C$_2$H$_5$ groups] Ph$_3$B$^\ominus$n-C$_4$H$_9$ | 552 nm |
| 2 | [bis-benzothiazole trimethine, N-C$_7$H$_{15}$ groups] Ph$_3$B$^\ominus$n-C$_4$H$_9$ | 568 nm |
| 3 | [bis-benzoxazole trimethine, N-n-C$_6$H$_{13}$ groups] Ph$_3$B$^\ominus$n-C$_4$H$_9$ | 492 nm |
| 4 | [bis-benzothiazole methine, N-CH$_3$ groups] Ph$_3$B$^\ominus$n-C$_4$H$_9$ | 428 nm |
| 5 | [thionine-type dye with (CH$_3$)$_2$N and N(CH$_3$)$_2$ groups] Ph$_3$B$^\ominus$n-C$_4$H$_9$ | 658 nm |

-continued
6 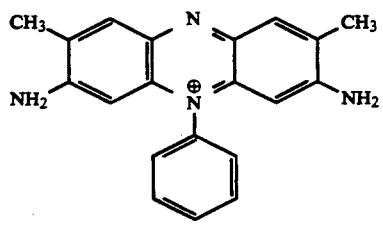 528 nm
Ph₃B⊖n-C₄H₉
7 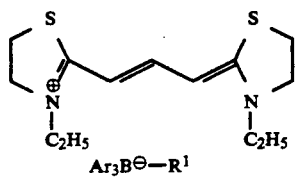 450 nm
Ar₃B⊖—R¹
| No. | R¹ | Ar |
|-----|--------|--------|
| 7A | n-Butyl | Phenyl |
| 7B | n-Hexyl | Phenyl |
| 7C | n-Butyl | Anisyl |
8 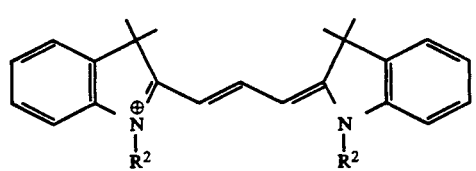 550 nm
Ar₃B⊖—R¹
| No. | R² | R¹ | Ar |
|-----|-----------|---------|--------|
| 8A | Methyl | n-Butyl | Phenyl |
| 8B | Methyl | n-Hexyl | Phenyl |
| 8C | n-Butyl | n-Butyl | Phenyl |
| 8D | n-Butyl | n-Hexyl | Phenyl |
| 8E | n-Heptyl | n-Butyl | Phenyl |
| 8F | n-Heptyl | n-Hexyl | Phenyl |
| 8G | Ethyl | n-Butyl | Phenyl |
9 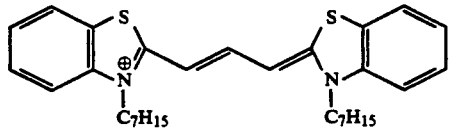 570 nm
(CH₃O—⌬—)₃B⊖C₄H₉
10 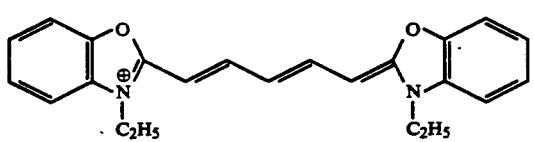 590 nm
(CH₃O—⌬—)₃B⊖C₄H₉

-continued

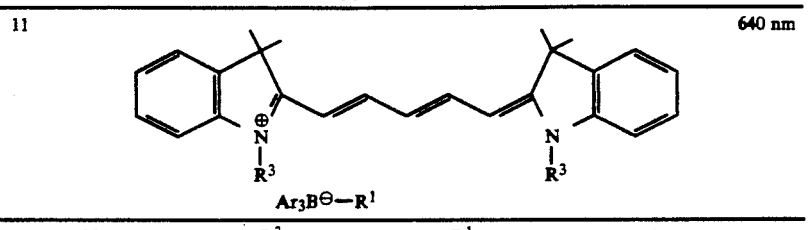

| No. | $R^3$ | $R^1$ | Ar |
|---|---|---|---|
| 11A | Methyl | n-Butyl | Phenyl |
| 11B | Methyl | n-Hexyl | Phenyl |
| 11C | n-Butyl | n-Butyl | Phenyl |
| 11D | n-Butyl | n-Hexyl | Phenyl |
| 11E | n-Pentyl | n-Butyl | Phenyl |
| 11F | n-Pentyl | n-Hexyl | Phenyl |
| 11G | n-Heptyl | n-Butyl | Phenyl |
| 11H | n-Heptyl | n-Hexyl | Phenyl |
| 11I | Methyl | n-Butyl | Anisyl |

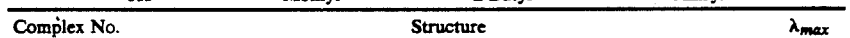

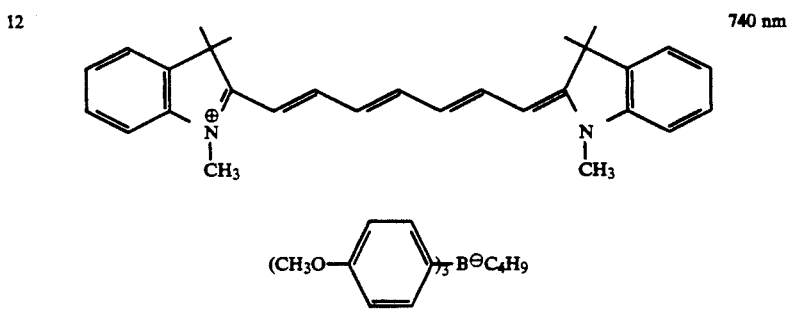

Known photo-decomposable aromatic diazo compounds can be used. Examples of such known compounds include diazonium salts, diazosulfonate, iminoquinone diazide and naphthoquinone diazide as described, for example, in J. Koser, Light Sensitive Systems (John Wiley & Sons Inc.), Chapters 6 and 7. These aromatic diazo compounds all can be used in the present invention. From the standpoint of stability of the borate anion, nonionic aromatic diazo compounds such as iminoquino diazide or naphthoquinone diazide are preferred. If a diazonium salt is used, a diazo compound containing a weak acid group such as organic carboxylic acid is more preferred as an anion portion of the diazonium salt than that containing a strong acid group such as $PF_6-$ from this standpoint.

In order to apply the present sensitization process to a diazo process, the above mentioned cationic dye/borate anion complex can be incorporated in a light-sensitive layer comprising a known diazo photographic material.

The amount of the cationic dye/borate anion complex to be incorporated in the photo-decomposable diazo compound is not specifically limited. In general, the molar ratio of diazo compound to dye complex is preferably in the range of 1/0.01 to 1.

If such a light-sensitive composition is used in a photopolymerization system, a cationic dye/borate anion complex compound and an aromatic diazo compound may be incorporated in a known photopolymerizable light-sensitive composition as photopolymerization initiators as described, for example, in JP-A 62-143044. The ratio of the cationic dye/borate anion complex compound and the aromatic diazo compound is not specifically limited. In general, the molar ratio of dye complex to diazo compound is preferably in the range of 1/0.1 to 1/10.

Radical-polymerizable unsaturated compounds which can be used for the formation of a photopolymerizable light-sensitive composition preferably include unsaturated esters of polyol, particularly acrylic or methacrylic esters. Specific examples of such esters include ethylene glycol diacrylate, glycerin triacrylate, polyacrylate, ethylene glycol dimethacrylate, 1,3-propanediol dimethacrylate, polyethylene glycol dimethacrylate, 1,2,4-butanetriol trimethacrylate, trimethyolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,5-pentadiol dimethacrylate, bisacrylate and bismethacrylate of polyethylene glycol having a molecular weight of 200 to 400 and analogous compounds.

Unsaturated compounds such as unsaturated amides can also be used. Examples of such unsaturated amides include acrylic and methacrylic unsaturated amides and ethylenebismethacrylamides containing a, ω-diamine. The alkylene chain in such an unsaturated amide may be opened by a carbon atom. However, the photopolymerizable monomer is not limited to these compounds.

An organic polymer binder can be optionally used. Organic polymer binders preferably used include a high polymer vinyl compound from the standpoint of compatibility with the above mentioned monomer compound and cationic dye/borate anion complexes. Examples of such high polymer vinyl compounds include polyetyrene, polyvinyl chloride, polyacrylic acid, methyl polyacrylate, ethyl polyacrylate, butyl polyacrylate, polymethacrylic acid, methyl polymethacrylate, benzyl polymethacrylate, polyvinyl ether, polyvinyl acetal, polyacrylonitrile, 2-ethylhexyl polyacrylate, 2-ethylhexyl polymethacrylate, polymaleic acid, and copolymers thereof. However, the present invention should not be construed as being limited to these compounds.

The optimum mixing ratio of the photopolymerizable monomer compound and the organic polymer binder depends on the combination of the monomer compound and the organic polymer binder used, but normally is preferably in the range of 1:10 to 2:1 by weight. In this case, the amount of the cationic dye/borate anion complex to be incorporated is preferably in the range of 0.01 to 20% by weight based on the weight of the monomer compound.

The present invention will be further described in the following examples, but the present invention should not be construed as being limited thereto.

Unless otherwise spectral, all percents, ratios, parts, etc., are by weight.

EXAMPLE 1

A light-sensitive solution of the following composition was coated on a 100 μm thick polyethyleneterephthalate film to a dry thickness of 2 μm.

| | |
|---|---|
| Benzylmethacrylate/methacrylic acid copolymer (molar ratio: 67/33, [η]: 0.13 [in MEK at 23° C.]) | 1.3 g |
| Dioctyl phthalate: | 0.77 g |
| Cyanine borate compound of complex No. 8E: | 0.165 g |
| Iminoquinone diazide of the following structure | 0.1 g |

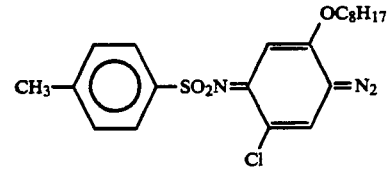

$\lambda_{max}$ = 378 nm:

| | |
|---|---|
| Methyl ethyl ketone: | 18 g |
| Ethylene glycol monomethylether acetate: | 6 g |

The film was then irradiated with light of a wavelength of 551.5 nm obtained by the use of a band-pass filter with (½)9 nm by means of a xenon acitonometer over 1,000 seconds (about 26 mJ/cm²). Another specimen of the same film was not exposed. The spectrum of the two specimens are shown in the Figure. The Figure shows that the exposed diazo compound can be efficiently decomposed by the borate compound of Complex No. 8E.

EXAMPLE 2

A light-sensitive solution of the following composition was coated on a 100 μm thick hydrophilicized aluminum plate to a dry thickness of 1 μm.

| | |
|---|---|
| Phenol resin PR-50716 (Sumitomo Dures Co., Ltd.): | 0.25 g |
| Phenol resin 51600B (Sumitomo Dures Co., Ltd.): | 0.35 g |
| 1,2-Naphthoquinone(2)diazide-4-sulfonic acid-p-t-octylphenylester: | 0.21 g |
| Cyanine borate of No. 8E: | 0.062 g |
| Butyl acetate: | 6 g |
| Propyl acetate: | 4 g |

The light-sensitive material thus prepared was then patternwise exposed to light obtained by cutting off light at a wavelength of 500 nm or less through an SC-52 filter from ORC Co., Ltd.'s Jetlight 2000.

The light-sensitive material was then developed with a developing solution obtained by diluting Fuji Photo Film's Developer DP-4 for PS plate 30-fold to obtain a positive image. With this light-sensitive material as a printing plate, 10,000 sheets could be printed.

EXAMPLE 3

The following three light-sensitive solutions were prepared. These light-sensitive solutions were each coated on a 100 μm thick polyethylene terephthalate film to a dry thickness of 2 μm.

| Running Solution | |
|---|---|
| Benzyl methacrylate/methacrylic acid copolymer (molar ratio: 67/33, [η]: 0.13 [in MEK at 23° C.]: | 1.3 g |
| Pentaerythritol tetraacrylate: | 1.4 g |
| Methyl ethyl ketone: | 12 g |
| Ethylene glycol monomethylether acetate: | 7.5 g |

Sample I

Comparative Example

The cyanine borate compound No. 8E was added to the running solution in an amount of 0.083 g.

Sample II

Present Invention

The cyanine borate compound and the diazo compound of Example 2 were added to the running solution in amounts of 0.083 g and 0.087 g, respectively.

Sample III

Present Invention

The cyanine borate compound No. 8E and the diazo compound of Example 1 were added to the running solution in amounts of 0.083 g and 0.087 g, respectively.

The following protective layer was then coated on Samples I, II and III to a dry thickness of 1.5 μm.

| | |
|---|---|
| Polyvinyl alcohol PVA-205 (Nihon Gosei Kagaku K.K.): | 40 g |
| Water | 1 l |

The three light-sensitive materials (Samples I, II and III) were exposed to light of a wavelength of 551 nm, developed with a developing solution obtained by diluting Fuji Photo Film's Developer CA-1 for plate making 5-fold, and then compared with each other for sensitivity. The results are set forth below.

| | |
|---|---|
| Sample I (comparative) | 3 mJ/cm² |
| Sample II (present invention) | 0.5 mJ/cm² |
| Sample III (present invention) | 0.9 mJ/cm² |

The results show that the addition of the diazo compounds causes a drastic increase in sensitivity.

Further, when each diazo compound was used alone, an image was not formed in all cases.

EXAMPLE 4

Light-sensitive materials were prepared in the same manner as in Example 3 except that the following cationic dye/borate anion complexes were added to the running solution. These samples were then compared with each other for sensitivity.

| Sample IV | |
|---|---|
| Rhodamine 6G/Ph$_3$—B$^-$-nC$_4$H$_9$: | 0.083 g |
| Diazo compound of Example 2: | 0.087 g |
| Sample V | |
| Rhodamine 6G/Ph$_3$—B$^-$-nC$_4$H$_9$: | 0.083 g |

The results are set forth below.

| Sample IV | 0.2 mJ/cm$^2$ |
|---|---|
| Sample V | 1.5 mJ/cm$^2$ |

The results show that the addition of the diazo compounds causes a drastic increase in sensitivity.

Further, when the diazo compound was used alone, an image was not formed.

While the invention has been described in detail and with reference to specific embodiments thereof, it will be apparent to one skilled in the art that various changes and modifications can be made therein without departing from the spirit and scope thereof.

What is claimed is:

1. A light-sensitive composition, consisting essentially of in admixture at least (a) a nonionic aromatic diazo compound and (b) a cationic dye/borate anion complex, wherein the light-sensitive composition upon imagewise exposure gives latent images which impart differential solubility between exposed and unexposed areas of the light sensitive composition in a developer.

2. A light-sensitive composition consisting essentially of, in admixture, at least:
   (1) (a) a nonionic aromatic diazo compound and (b) a cationic dye/borate anion complex, and
   (2) a radical-polymerizable unsaturated compound, wherein the light-sensitive composition upon imagewise exposure gives latent images which impart differential solubility between exposed and unexposed areas of the light sensitive composition in a developer.

3. The light-sensitive composition as claimed in claim 1, wherein said cationic dye/borate anion complex is represented by the general formula (I):

wherein D$^+$ represents a cationic dye; and R$_1$, R$_2$, R$_3$ and R$_4$, which may be the same or different, each represents an unsubstituted or substituted alkyl group, an unsubstituted or substituted aryl group, an unsubstituted or substituted aralkyl group, an unsubstituted or substituted alkenyl group, an unsubstituted or substituted alkynyl group, an unsubstituted or substituted alicyclic group, or an unsubstituted or substituted heterocyclic group.

4. The light-sensitive composition as claimed in claim 1, wherein said non-ionic diazo compound is selected from the group consisting of o-naphthoquinone diazide and iminoquinone diazide.

* * * * *